(12) United States Patent
Mourey et al.

(10) Patent No.: US 11,440,008 B2
(45) Date of Patent: Sep. 13, 2022

(54) MICROFLUIDIC DEVICE WITH CAPILLARY CHAMBER

(71) Applicant: HEWLETT-PACKARD DEVELOPMENT COMPANY, L.P., Houston, TX (US)

(72) Inventors: Devin Alexander Mourey, Corvallis, OR (US); Michael W Cumbie, Corvallis, OR (US); Garrett E Clark, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 613 days.

(21) Appl. No.: 16/084,765

(22) PCT Filed: Apr. 14, 2016

(86) PCT No.: PCT/US2016/027421
§ 371 (c)(1),
(2) Date: Sep. 13, 2018

(87) PCT Pub. No.: WO2017/180120
PCT Pub. Date: Oct. 19, 2017

(65) Prior Publication Data
US 2019/0060898 A1     Feb. 28, 2019

(51) Int. Cl.
*B01L 3/00* (2006.01)
*B41J 2/14* (2006.01)
(Continued)

(52) U.S. Cl.
CPC ....... *B01L 3/502738* (2013.01); *B01L 3/0268* (2013.01); *B41J 2/1404* (2013.01);
(Continued)

(58) Field of Classification Search
None
See application file for complete search history.

(56) References Cited

U.S. PATENT DOCUMENTS

| 5,958,344 A | 9/1999 | Levine et al. |
| 6,444,106 B1 | 9/2002 | McBride et al. |

(Continued)

FOREIGN PATENT DOCUMENTS

| CN | 1521500 A | 8/2004 |
| CN | 1844681 A | 10/2006 |

(Continued)

OTHER PUBLICATIONS

Garstecki, P., et al., "Formation of bubbles and droplets in microfluidic systems." Technical Sciences, vol. 53., No. 4 (2005), pp. 361-372.

(Continued)

*Primary Examiner* — Lore R Jarrett
(74) *Attorney, Agent, or Firm* — Dicke Billig & Czaja PLLC

(57) ABSTRACT

Examples include microfluidic devices. Example microfluidic devices comprise a microfluidic channel, a capillary chamber, and a fluidic actuator. The microfluidic channel is fluidly connected to the capillary chamber. The capillary chamber is to restrict flow of fluid therethrough. The fluidic actuator is positioned proximate the capillary chamber. The fluidic actuator is to actuate to thereby initiate flow of fluid through the capillary chamber.

20 Claims, 8 Drawing Sheets

(51) Int. Cl.
  *F16K 99/00* (2006.01)
  *B01L 3/02* (2006.01)
  *B81B 7/00* (2006.01)
  *B81B 1/00* (2006.01)

(52) U.S. Cl.
  CPC ............ *B81B 7/00* (2013.01); *F16K 99/0017* (2013.01); *F16K 99/0044* (2013.01); *F16K 99/0048* (2013.01); *B01L 2200/0673* (2013.01); *B01L 2300/1827* (2013.01); *B01L 2400/0442* (2013.01); *B01L 2400/0655* (2013.01); *B01L 2400/0688* (2013.01); *B81B 1/002* (2013.01)

(56) References Cited

U.S. PATENT DOCUMENTS

| | | | |
|---|---|---|---|
| 6,444,173 | B1 | 9/2002 | Sjursen et al. |
| 6,742,861 | B2 | 6/2004 | McCarty |
| 7,467,858 | B2 | 12/2008 | Lebron et al. |
| 7,819,507 | B2 | 10/2010 | Brown et al. |
| 8,500,244 | B2 | 8/2013 | Brown et al. |
| 2003/0007898 | A1* | 1/2003 | Bohm .............. B01L 3/0268 422/53 |
| 2003/0092172 | A1 | 5/2003 | Oh et al. |
| 2003/0196714 | A1* | 10/2003 | Gilbert ............ B01L 3/502761 137/828 |
| 2005/0133101 | A1 | 6/2005 | Chung et al. |
| 2005/0217741 | A1 | 10/2005 | Bohm |
| 2007/0006926 | A1 | 1/2007 | Prakash |
| 2007/0042503 | A1 | 2/2007 | Handique et al. |
| 2007/0286774 | A1 | 12/2007 | Barholm-Hansen et al. |
| 2010/0159590 | A1* | 6/2010 | Alley ................. C12M 23/40 435/374 |
| 2011/0203700 | A1 | 8/2011 | Scholten et al. |
| 2013/0061962 | A1* | 3/2013 | Kornilovich ............ F17D 3/00 137/565.17 |
| 2013/0155152 | A1* | 6/2013 | Govyadinov ........ B41J 2/14201 347/54 |
| 2014/0035978 | A1 | 2/2014 | Sasagawa et al. |
| 2015/0040999 | A1 | 2/2015 | Vulto et al. |
| 2015/0053268 | A1* | 2/2015 | Murphy .............. B41J 2/17523 137/1 |
| 2015/0238952 | A1 | 8/2015 | Vulto et al. |
| 2015/0238961 | A1 | 8/2015 | Vrouwe et al. |

FOREIGN PATENT DOCUMENTS

| | | |
|---|---|---|
| CN | 102985831 A | 3/2013 |
| CN | 104153978 A | 11/2014 |
| JP | 2000510046 A | 8/2000 |
| JP | 2002527250 A | 8/2002 |
| JP | 2005509424 A | 4/2005 |
| JP | 2005514187 A | 5/2005 |
| JP | 2009204339 A | 9/2009 |
| JP | 2015066717 A | 4/2015 |
| TW | 200909338 A | 3/2009 |
| WO | WO-9807069 A1 | 2/1998 |
| WO | WO-2017119902 A1 | 7/2017 |

OTHER PUBLICATIONS

Zimmermann, Martin, et al. "Capillary pumps for autonomous capillary systems." Lab on a Chip vol. 7, No. 1 (2007), pp. 119-125.

* cited by examiner

MICROFLUIDIC DEVICE WITH CAPILLARY CHAMBER

BACKGROUND

Microfabrication involves the formation of structures and various components on a substrate (e.g., silicon chip, ceramic chip, glass chip, etc.). Examples of microfabricated devices include microfluidic devices. Microfluidic devices include structures and components for conveying, processing, and/or analyzing fluids.

DRAWINGS

Figure 1:
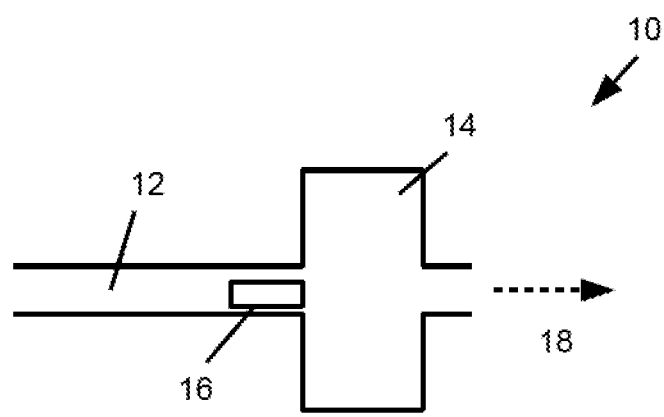

FIG. 1 provides a block diagram of some components of an example microfluidic device.

Figure 2A:
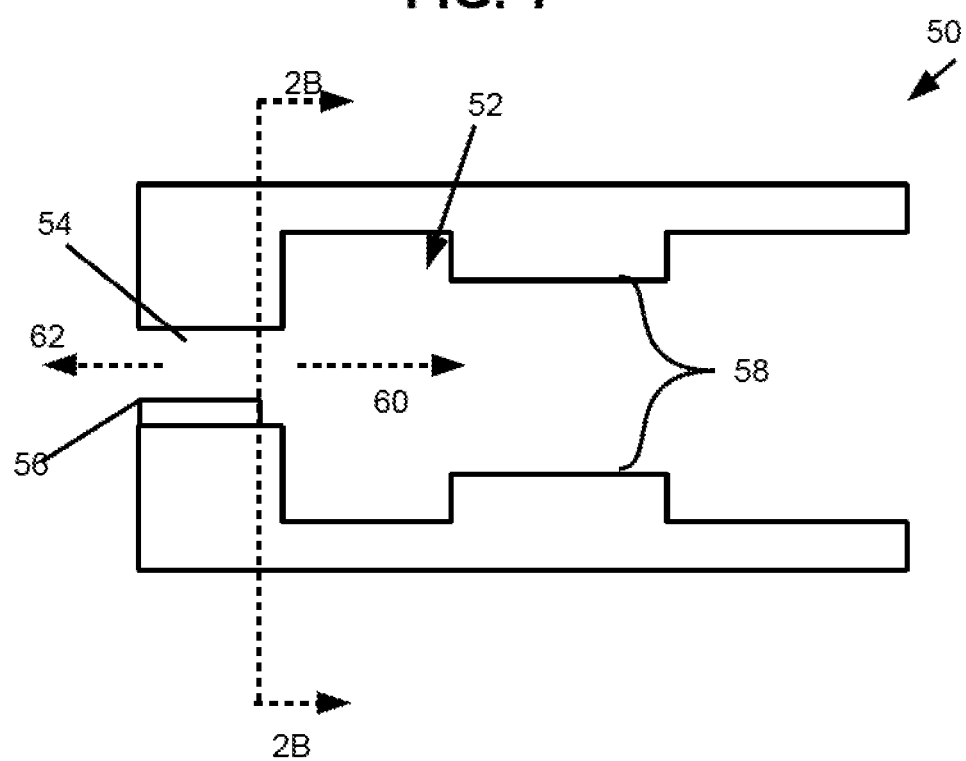

FIG. 2A provides a block diagram of some components of an example microfluidic device.

Figure 2B:
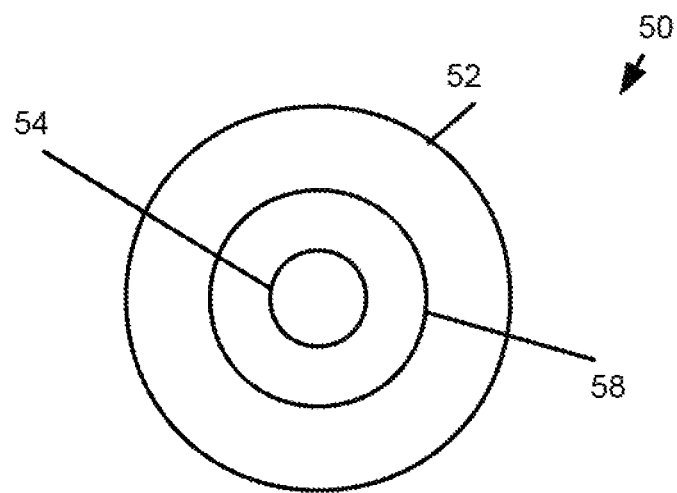

FIG. 2B provides a cross-sectional view of the components of the example microfluidic device of FIG. 2A along view line 2B-2B.

Figure 3:
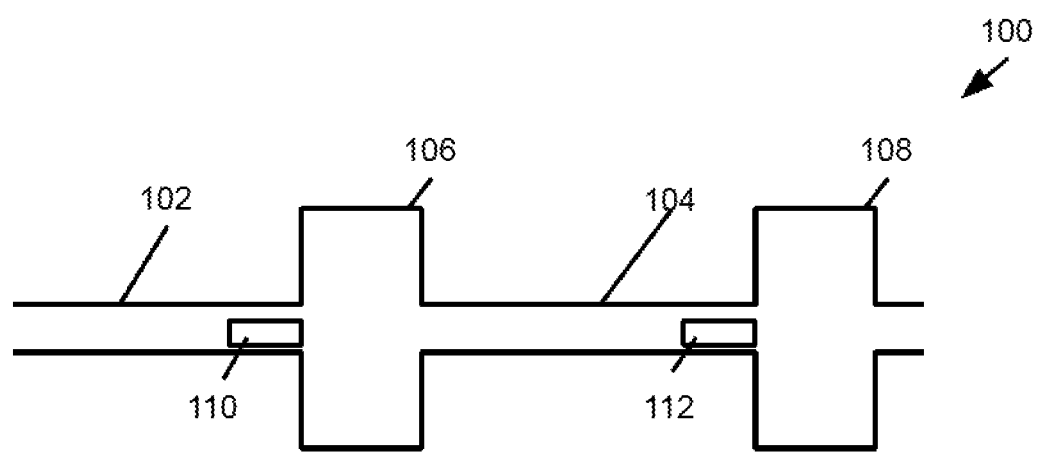

FIG. 3 provides a block diagram of some components of an example microfluidic device.

Figure 4:
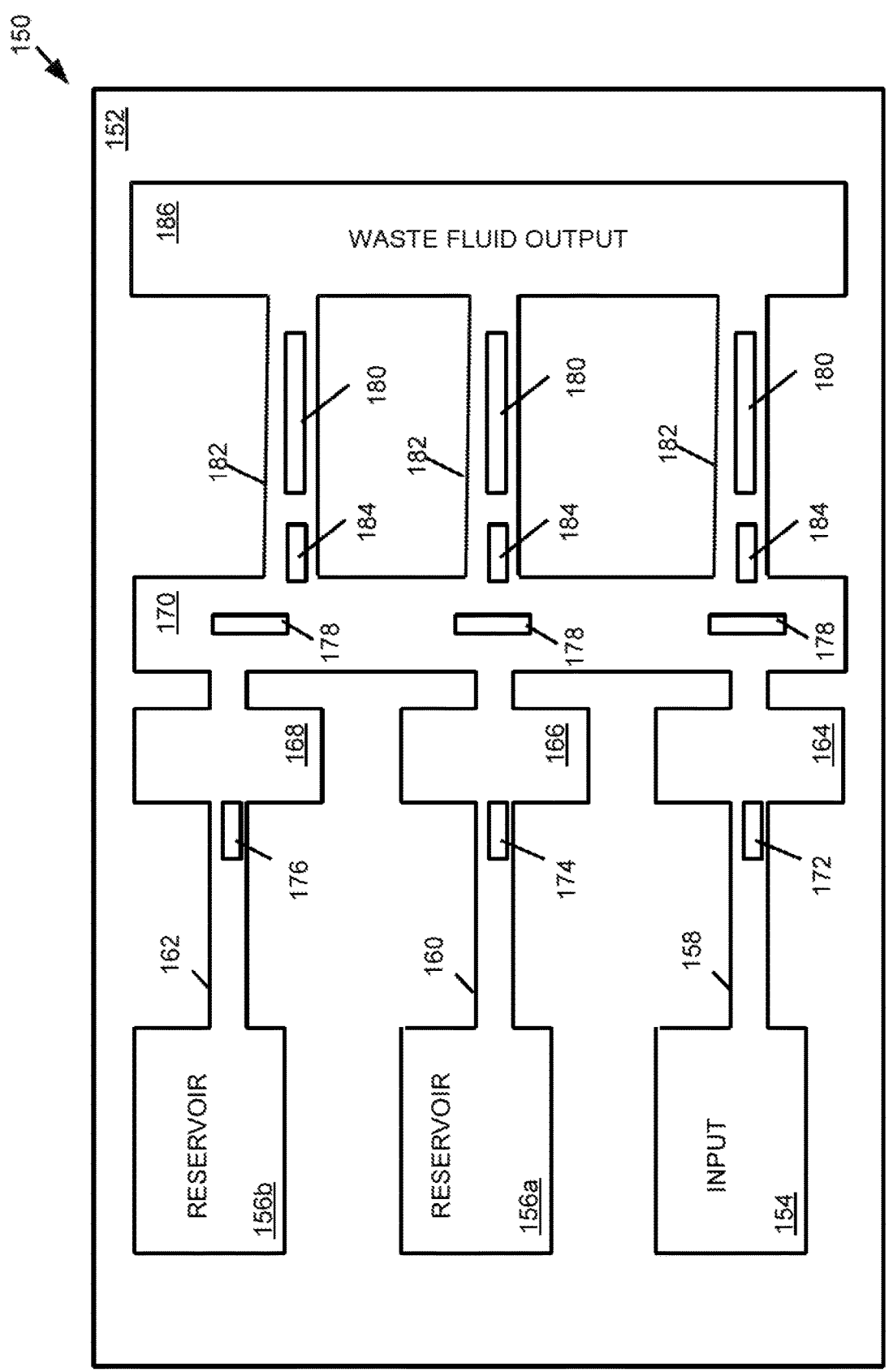

FIG. 4 provides a block diagram of some components of an example microfluidic device.

Figure 5A:
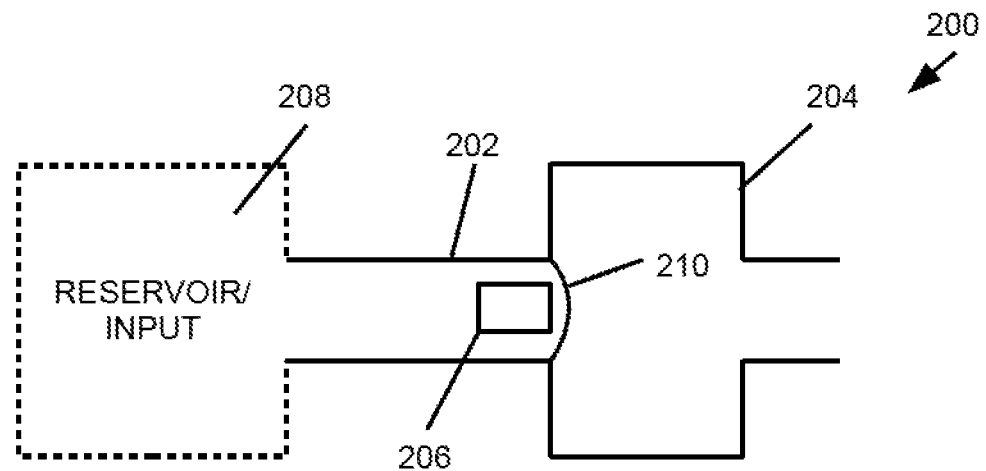
Figure 5B:
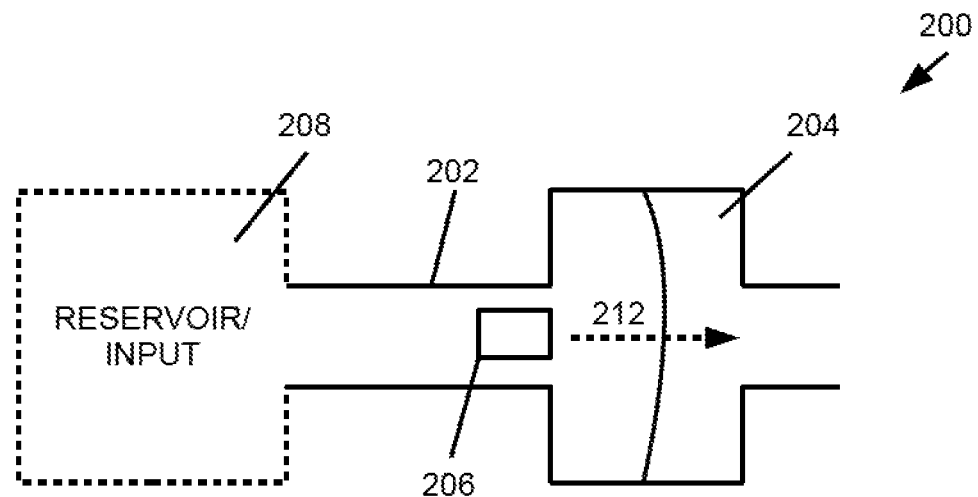

FIGS. 5A-B provide block diagrams of operation of some components of an example microfluidic device.

Figure 6A:
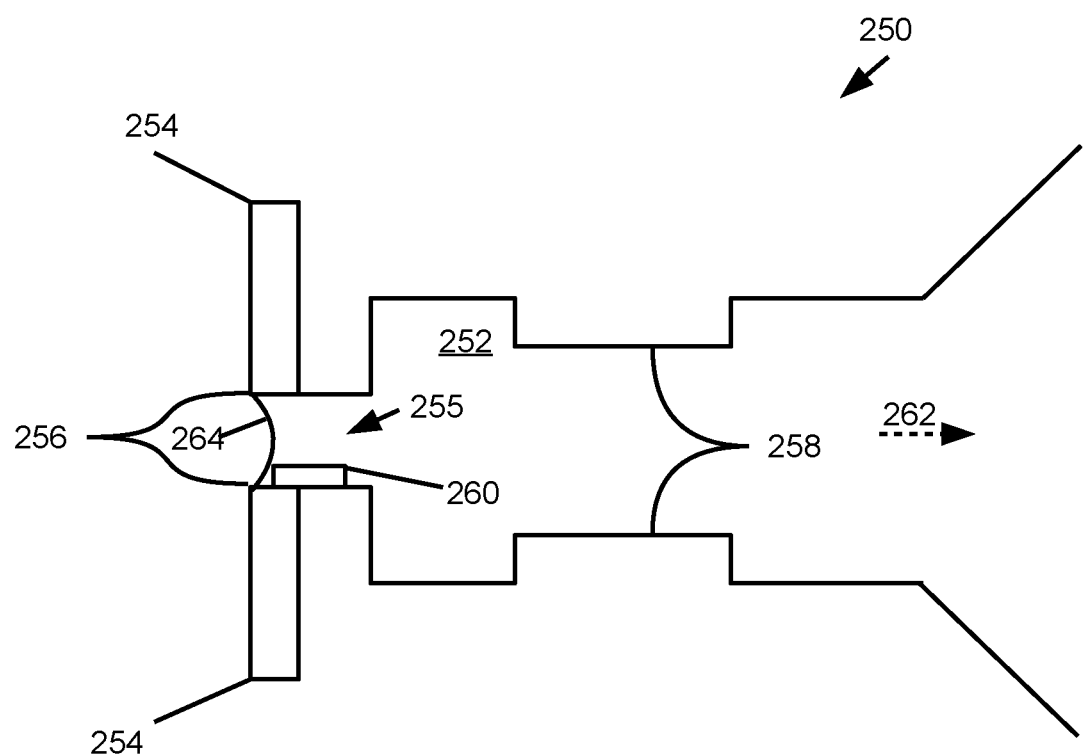
Figure 6B:
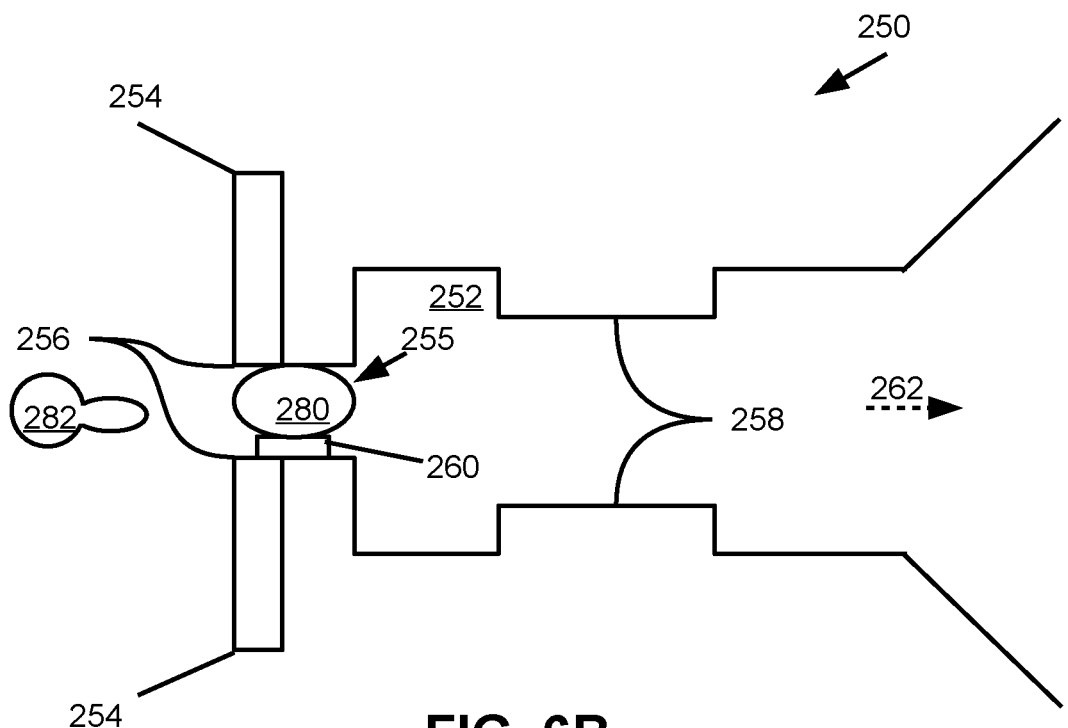
Figure 6C:
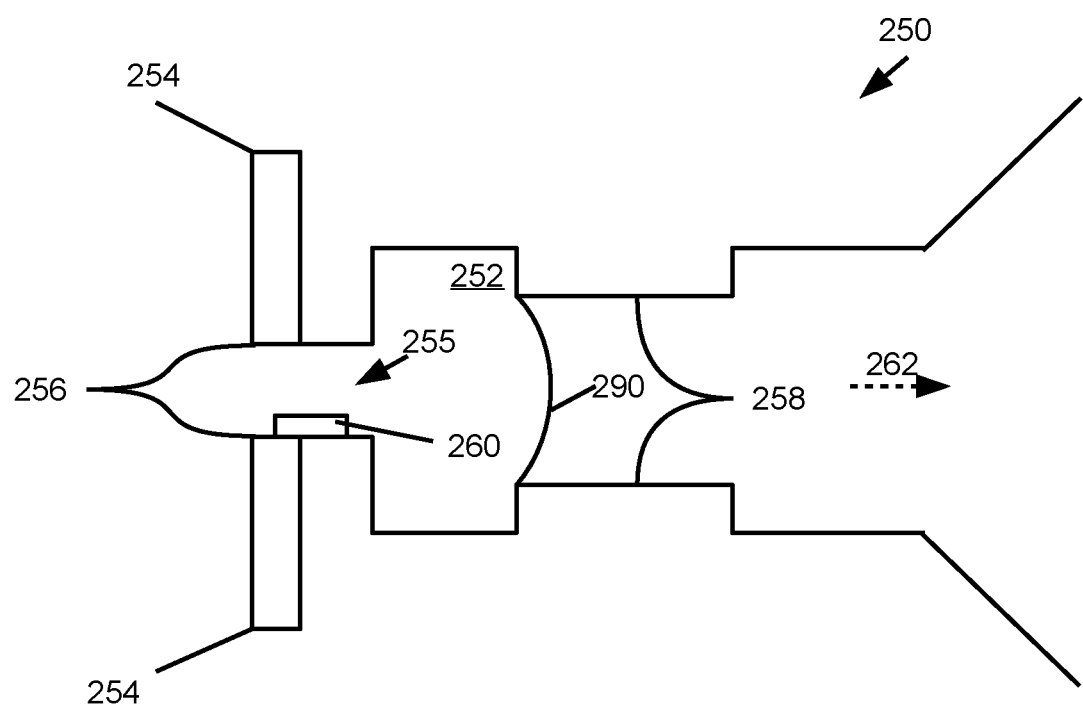

FIGS. 6A-C provide block diagrams of operation of some components of an example microfluidic device.

Figure 7:
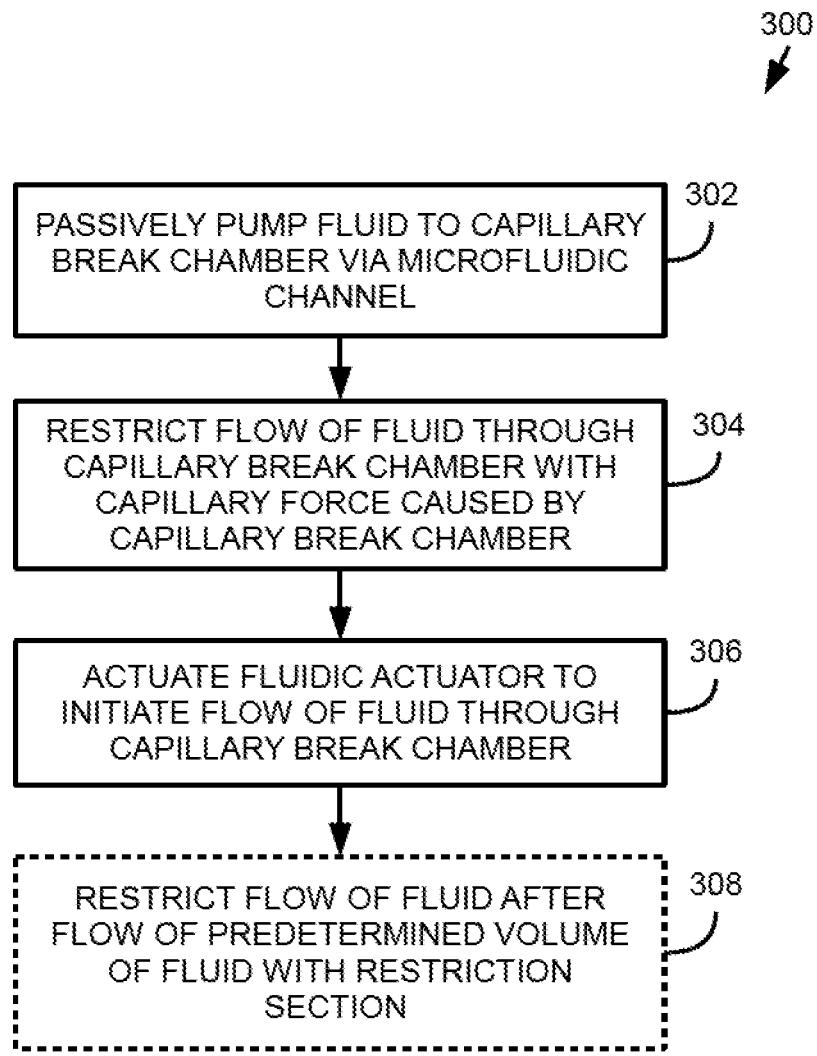

FIG. 7 provides a flowchart that illustrates the sequence of operations that may be performed by an example microfluidic device.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

DESCRIPTION

Examples provided herein include devices, methods, and processes for microfluidic devices. Some example microfluidic devices include lab-on-a-chip devices (e.g., polymerase chain reaction devices, chemical sensors, etc.), fluid ejection devices (e.g., inkjet printheads, fluid analysis devices, etc.), and/or other such microdevices having microfluidic structures and associated components. In example microfluidic devices described herein, the examples may comprise at least one microfluidic channel, at least one capillary chamber, and at least one fluidic actuator positioned proximate the capillary chamber.

As will be appreciated, examples provided herein may be formed by performing various microfabrication and/or micromachining processes on a substrate to form and/or connect structures and/or components. The substrate may comprise a silicon based wafer or other such similar materials used for microfabricated devices (e.g., glass, gallium arsenide, plastics, etc.). As discussed, examples may comprise microfluidic channels and/or volumetric chambers (which may be referred to herein as capillary chambers). Microfluidic channels and/or chambers may be formed by performing etching or micromachining processes in a substrate. Accordingly, microfluidic channels and/or chambers may be defined by surfaces fabricated in the substrate of a microfluidic device. Furthermore, examples described herein may comprise at least one fluidic actuator. Fluidic actuators that may be implemented in examples described herein may include, for example, thermal resistor based actuators, piezo-membrane based actuators, electrostatic membrane actuators, mechanical/impact driven membrane actuators, magneto-strictive drive actuators, and/or other such components.

In examples described herein a microfluidic channel may be fluidly connected to a capillary chamber. A fluidic actuator may be positioned proximate the capillary chamber. In such examples, passive pumping of fluid may occur in the microfluidic channel due to capillary force (also referred to as capillary action).

In some examples described herein, at least one dimension of the microfluidic channel and/or capillary chamber is therefore of sufficiently small size (e.g., of micrometer sized scale) to facilitate capillary force. In some examples, fluid may be passively pumped due to capillary force. In other examples, flow of fluid may be restricted due to capillary force. An example capillary chamber may be sized such that flow of the fluid by capillary action in the microfluidic device is stopped/restricted. Hence, the capillary chamber restricts flow of fluid. As used herein, restricting flow of fluid may comprise stopping/preventing flow of fluid. Furthermore, as used herein, it will be appreciated that restriction of fluid flow may be overcome by actuation of a fluidic actuator to thereby initiate flow of fluid. In examples described herein, flow of fluid may be initiated by actuation of the fluidic actuator, however it will be appreciated that the fluidic actuator may not be used as an active pump. Accordingly, energy usage (i.e., to power a fluidic actuator) may be less as compared to devices in which active pumps are used to facilitate flow of fluid. Examples of pumps include an inertial pump, a capillary pump, a thermal inkjet pump, or a pneumatic pump.

In examples described herein, a capillary chamber may therefore be implemented in a microfluidic device to restrict flow of fluid such that the capillary chamber may be implemented as a valve or a fluidic stop. Furthermore, a fluidic actuator may be positioned proximate the capillary chamber such that the fluidic actuator may be actuated to initiate flow of fluid through the microfluidic device (e.g., capillary chamber and/or microfluidic channel). In some examples, an outlet of the capillary chamber may be fluidly connected to a second microfluidic channel, such that, after actuation of the fluidic actuator (and initiation of fluid flow through the capillary chamber), fluid may be passively pumped through the second microfluidic channel by capillary action.

Turning now to the figures, and particularly to FIG. 1, this figure provides a block diagram that illustrates some components of an example microfluidic device 10. In this example, the microfluidic device 10 comprises a microfluidic channel 12, a capillary chamber 14, and a fluidic actuator 16 positioned proximate the capillary chamber 14. In this example, fluid may be passively pumped (by capillary action) through the microfluidic channel 12 to the capillary chamber 14, and the capillary chamber 14 may restrict flow of fluid therethrough. As will be appreciated, the transition between the microfluidic channel 12 and the capillary chamber 14 and surface tension of the fluid may cause occurrence of a meniscus in fluid at the connection between the microfluidic channel 12 and the capillary chamber 14. Hence, the fluid may be restricted from flowing through the capillary chamber 14. To initiate flow of fluid through the capillary chamber 14, the fluidic actuator 16 may be actuated. As will be appreciated, actuation of the fluidic actuator 16 may generate a force in the fluid restricted by the capillary chamber 14 sufficient to overcome the restriction force due to the meniscus of the fluid. Hence, upon actuation of the fluidic actuator 16, fluid may begin flowing through the capillary chamber 14. In this example, a direction of fluid flow after actuation of the fluidic actuator 16 is illustrated by example flow direction 18. Once some fluid has flowed through the capillary chamber, capillary action may further pump the fluid.

As will be appreciated, actuation of the fluidic actuator 16 may be of relatively short duration. In some examples, the fluidic actuator 16 may be pulsed at a particular frequency for a particular duration. In some examples, actuation of the fluidic actuator may be within a range of approximately 0.1 millisecond (mS) to approximately 10 mS. In some examples described herein, actuation of a fluidic actuator 16 comprises electrical actuation. In such examples, a controller may be electrically connected to a fluidic actuator 16 such that an electrical signal may be transmitted by the controller to the fluidic actuator 16 to thereby actuate the fluidic actuator 16.

For example, the fluidic actuator 16 may be a thermal resistor based actuator. In this example, actuation of the thermal resistor based actuator may cause the thermal resistor based actuator to generate heat. Generation of heat by the thermal resistor based actuator may in turn cause formation of a bubble in fluid proximate the thermal resistor based actuator. Formation and/or collapse of a generated bubble may cause displacement of proximate fluid. In this example, displacement of proximate fluid by such generated bubble may overcome the surface tension based force of a meniscus of the fluid caused by the capillary chamber to thereby cause flow of fluid through the capillary chamber 14.

As another example, the fluidic actuator may be a piezoelectric membrane based actuator. In this example, electrical actuation of the piezoelectric membrane based actuator may cause movement of the piezoelectric membrane based actuator. Movement of the piezoelectric membrane based actuator may, in turn, cause displacement of fluid proximate the piezoelectric membrane based actuator. In this example, displacement of proximate fluid by such piezoelectric membrane based actuator may overcome the surface tension based force of a meniscus of the fluid caused by the capillary chamber to thereby cause flow of fluid through the capillary chamber 14.

FIG. 2A provides a block diagram that illustrates some components of an example microfluidic device 50. In this example, the device 50 comprises a microfluidic channel 52 that is fluidly connected to a capillary chamber 54. A fluidic actuator 56 is positioned proximate the capillary chamber 54. Furthermore, in this example, the example device comprises a restriction section 58. The microfluidic channel 52 and capillary chamber 54 may be under backpressure in the direction illustrated by directional arrow 60. Therefore, in this example, flow of fluid through the microfluidic channel 52 and/or capillary chamber 54 may be restricted due to surface tension of a meniscus of the fluid that occurs at the capillary chamber 54. Hence, the force exerted on fluid due to applied backpressure may not be sufficient to overcome the restrictive force caused by surface tension of the meniscus at the capillary chamber 54.

In this example, actuation of the fluidic actuator 56 may initiate flow of fluid in the direction of the example directional arrow 60 (i.e., in the direction of the backpressure). As will be noted, however, actuation of the fluidic actuator 56 may also cause ejection of a droplet of fluid out of the capillary chamber 54 in a direction illustrated with example directional arrow 62 (a direction that is opposite the direction of backpressure). After actuation of the fluidic actuator 56, fluid may flow through the capillary chamber 54, the microfluidic channel 52, and, the restriction section 58 in the backpressure direction (i.e., example directional arrow 60). In this example, as fluid flows in the direction of the backpressure, fluid may flow through the restriction section 58. After a predetermined volume of fluid has flowed through the capillary chamber 54, microfluidic channel 52, and the restriction portion 58 a meniscus may occur at the restriction section 58, such that surface tension of the meniscus occurring at the restriction section 58 may restrict further flow of fluid through the microfluidic device 50.

FIG. 2B provides a cross-sectional view along view line 2B-2B of the example microfluidic device 50 of FIG. 2A. In this example, the microfluidic channel 52, capillary chamber 54, and the restriction portion 58 are illustrated with circular cross-sectional areas. However, it will be appreciated that various other geometries may be implemented. For example, rectangular and/or trapezoidal cross-sectional areas may be used in various microfluidic channels, capillary chambers, and/or restriction portions. It will be in noted in the example of FIG. 2A-2B that the microfluidic channel 52 has at least one dimension (e.g., a diameter, radius, width, height, etc.) that is greater than at least one dimension of the capillary chamber 54. In addition, the restriction portion 58 has at least one dimension that is less than at least one dimension of the microfluidic channel 54. As will be appreciated, different examples may have different dimensions and relative sizes for various features.

FIG. 3 provides a block diagram of some components of a microfluidic device 100. In this example, the microfluidic device 100 comprises a first microfluidic channel 102 and a second microfluidic channel 104. As shown, the first microfluidic channel 102 is fluidly connected to a first capillary chamber 106, and the second microfluidic channel 104 is fluidly connected to the first capillary chamber 106 and a second capillary chamber 110. Furthermore, the microfluidic device 100 comprises a first fluidic actuator 110 positioned proximate the first capillary chamber 106 and a second fluidic actuator 112 positioned proximate the second capillary chamber 108. Hence, in this example, the first microfluidic channel 104 is connected to an inlet of the first capillary chamber 106, the second microfluidic channel 104 is connected to an outlet of the first capillary chamber 106, and the second microfluidic channel 104 is connected to an inlet of the second capillary chamber 108. While not shown, an outlet of the second capillary chamber 108 may be further connected to another microfluidic channel or other components of the microfluidic device 100. Furthermore, it will be appreciated that the arrangement of microfluidic channels 102, 104 and capillary chambers 106, 108 of this example may be described as a series arrangement.

Accordingly, in the example of FIG. 3, fluid may be passively pumped through the first microfluidic channel 102 by capillary action to the first capillary chamber 106. The first capillary chamber 106 may restrict flow of such fluid therethrough. The first fluidic actuator 110 may be actuated to thereby initiate flow of fluid through the first capillary chamber 106 to the second microfluidic channel 104. Fluid may be passively pumped through the second microfluidic channel 104 by capillary action to the second capillary chamber 108. The second capillary chamber 108 may restrict flow of fluid therethrough. The second fluidic actuator 112 may be actuated to thereby initiate flow of fluid through the second capillary chamber 108. Therefore, as will be appreciated, pumping of fluid may be caused by capillary action in the microfluidic channels 102, 104, and the fluidic actuators 110, 112 may be actuated to cause flow of fluid to occur through the capillary chambers 106, 108.

FIG. 4 provides a block diagram that illustrates some components of an example microfluidic device 150. In this example, the microfluidic device 150 comprises a substrate 152. As discussed previously, various structures/components (e.g., microfluidic channels, capillary chambers, fluid inputs, fluid reservoirs, etc.) may be microfabricated in a substrate in some examples. In this example, the microfluidic device 150 comprises a fluid input 154 and fluid reservoirs 156a, 156b. A first microfluidic channel 158 is fluidly connected to the fluid input 154, a second microfluidic channel 160 is fluidly connected to a first reservoir 156a, and a third microfluidic channel 162 is connected to a second reservoir 156b.

In this example, the microfluidic device 100 may be a lab-on-a-chip implementation, where the device may be used to process and/or analyze a fluid sample. A fluid sample may be input for processing/analysis via the fluid input 154. As will be appreciated, additional reagents for processing analysis may be stored in the fluid reservoirs 156a, 156b. As shown, the first microfluidic channel 158 may be fluidly connected to a first capillary chamber 164; the second microfluidic channel 160 may be fluidly connected to a second capillary chamber 166; and the third microfluidic channel may be fluidly connected to a third capillary chamber 168. Therefore, it will be appreciated that fluid may be passively pumped: from the fluid input 154 to the capillary chamber 164 via the first microfluidic channel 158; from the first reservoir 156a to the second capillary chamber 166 via the second microfluidic channel 160; and from the second reservoir 156b to the third capillary chamber 168. It will be appreciated that the arrangement of the microfluidic channels 158-162 and capillary chambers 164-168 of this example may be described as a parallel arrangement.

As described in previous examples, each capillary chamber 164-168 may restrict flow of fluid therethrough. Accordingly, fluid may flow from the input 154, first reservoir 156a, and second reservoir 156b through the microfluidic channel 158-162 to the capillary chamber 164-168, where flow of the fluid may be restricted by the capillary chamber 164-168. In this example, each capillary chamber 164-168 is fluidly connected to a mixing chamber 170. The microfluidic device 150 further comprises a fluidic actuator 172-176 proximate each capillary chamber 164-168.

In this example a first fluidic actuator 172 may be actuated to initiate flow of fluid through the first capillary chamber 164 to thereby cause pumping of fluid from the input 154 to the mixing chamber 170. Similarly, a second fluidic actuator 174 may be actuated to initiate flow of fluid through the second capillary chamber 166 to cause pumping of fluid from the first reservoir 156a to the mixing chamber 170. In addition, a third fluidic actuator 176 may be actuated to initiate flow of fluid through the third capillary chamber 168 to cause pumping of fluid from the second reservoir 156b to the mixing chamber 170. As shown, the microfluidic device 150 may comprise additional components 178 disposed in the mixing chamber 170. The additional components 178 may comprise mixing actuators disposed in the mixing chamber, where the mixing actuators may be actuated to thereby cause mixing of fluids in the mixing chamber (such as fluids from the input 154, the first reservoir 156a, and/or the second reservoir 156b). In some examples, the additional components 178 may comprise heating elements, where the heating elements may be electrically actuated to cause heating of fluid in the mixing chamber 170.

In this example, the microfluidic device 150 may comprise detectors 180 disposed in microfluidic channels 182 fluidly connected to the mixing chamber 170. In some examples. the detector 182 may be a sensor for analyzing fluid samples and performing various types of testing (e.g., DNA testing, chemical presence testing, etc.). For example, the detector 180 may comprise an optical sensor system (that may include an optical sensor for use with an integrated or external light source). As another example, the detector 180 may comprise an electrical impedance sensor. In some examples, the detector 180 may comprise a temperature sensor. In one example, the detector 180 may comprise an electrochemical sensor. As will be appreciated, examples incorporating a detector on a common substrate (also referred to as "on-chip") may be referred to as a lab-on-a-chip device. The substrate may comprise any suitable material, including silicon. The substrate may have any suitable geometry, including shape and sizes. For example, the shape may be a parallelogram, such as a square, a rectangle, or any other shape. The shape may also be an irregular shape. The size of the substrate need not be of any particular value. In some examples, the dimensions may be in the millimeter range. The term "dimensions" may refer to width, length, etc., depending on the shape of the substrate. For example, the length of the substrate may be between 0.5 mm and 10 mm—e.g., between 1 mm and 8 mm, between 2 mm and 6 mm, etc. Other values are also possible. In one example, the length is 2 mm. For example, the width of the substrate may be between 0.1 mm and 5 mm—e.g., between 0.5 mm and 4 mm, between 1 mm and 2 mm, etc. Other values are also possible.

Moreover, in some examples, each detector of a microfluidic device may comprise different configurations and combinations of sensors. Some examples described herein may facilitate analysis of a sample provided at the fluid input 154 with at least one on-chip detector 180.

As shown, the microfluidic device 150 may comprise fluidic actuators 184 to actuate to thereby cause pumping of fluid from the mixing chamber 170 to the microfluidic channels 182 in which the detectors 180 may be disposed. Accordingly, in examples similar to the example microfluidic device 150 of FIG. 4, fluid from the mixing chamber 170 may be pumped into the microfluidic channels 182 in which the detectors 180 are disposed such that such fluid may be analyzed with the detectors 180. The microfluidic channels 182 in which the detectors 180 are disposed may output to a waste fluid output 186.

As will be appreciated, in examples similar to the microfluidic device 150 of FIG. 4, the fluidic actuators 172-176, additional components 178, fluidic actuators 184, and/or detectors 180 may be electrically connected to a controller. Accordingly, the controller may electrically actuate these components, and the controller may receive data in the form of electrical signals from these components. For example, the controller may receive sensor data from the detectors 180 that corresponds to analysis of fluid.

While the term "controller" may be used herein, it will be appreciated that a controller may comprise various types of data processing resources. A controller may include, for example, at least one hardware based processor. Similarly, a controller may comprise one or more general purpose data processors and/or one or more specialized data processors. For example, a controller may comprise a central processing unit (CPU), an application-specific integrated circuit (ASIC), and/or other such configurations of logical components for data processing. In some examples, the controller may comprise a memory resource that stores executable instructions. Execution of instructions may cause the controller and/or device to perform functionalities, processes, and/or sequences of operations described herein. Furthermore, in the examples, the memory resource may comprise a machine-readable storage medium, which may be referred to as a memory. The memory resource may represent random access memory (RAM) devices as well as other types of memory (e.g. cache memories, non-volatile memory devices, read-only memories, etc.). A memory resource may include RAM, ROM, erasable programmable read-only memory (EPROM), electrically erasable programmable read-only memory, flash memory or other solid state memory technology, or any other medium that may be used to store executable instructions and information. Furthermore, the memory resource 556 may be non-transitory.

In some examples, the controller externally located (e.g., in a data processing system) and may be electrically connected to components of an example microfluidic device via electrical connections and conductive traces of the microfluidic device. In other examples, the microfluidic device may comprise a controller disposed on a common substrate and electrically connected to components of the microfluidic device via conductive traces.

Moreover, while the example device 150 of FIG. 4 illustrates three microfluidic channels 172-176 fluidly connected to three capillary chambers 164-168. it will be appreciated that various other combinations of microfluidic fluidic channels and capillary chambers may be implemented in other examples. For example, more or less microfluidic channels may be connected in sequence and/or parallel to more or less capillary chambers. Furthermore, more or less detectors 180, inputs 154. reservoirs 156a-b. fluidic actuators 172-176, and/or additional components 178 may be implemented in similar examples.

FIGS. 5A-B provide block diagrams that illustrate flow of a fluid in an example microfluidic device 200. In the examples, the microfluidic device 200 comprises a microfluidic channel 202 that is fluidly connected to a capillary chamber 204. In addition, a fluidic actuator 206 is positioned proximate the capillary chamber 204. As shown, the microfluidic channel 202 may fluidly connect the capillary chamber 204 to a fluid reservoir or input 208. As shown in FIG. 5A, fluid may be passively pumped from the reservoir/input 208 to the capillary chamber 204 due to capillary action in the microfluidic channel 202. In FIG. 5A, a meniscus 210 of the fluid occurs at the connection between the microfluidic channel 202 and the capillary chamber 204. Therefore, changes in dimensions from the microfluidic channel 202 to the capillary chamber 204 may cause a meniscus 210 to occur such that flow of the fluid through the capillary chamber 204 may be restricted. FIG. 5B illustrates an initiation of fluid flow through the capillary chamber 204 in a direction illustrated by a directional arrow 212. In this example, flow of fluid through the capillary chamber 204 may be initiated by actuation of the fluidic actuator 206. For example, if the fluidic actuator is a piezoelectric membrane based actuator, the fluidic actuator may be pulsed to cause displacement of fluid proximate the fluidic actuator. Displacement of fluid proximate the fluidic actuator may cause a pumping force that overcomes a restrictive force of the capillary chamber 204 due to the meniscus 210.

As will be appreciated in the example of FIGS. 5A-B, the capillary chamber 204 has at least one dimension (e.g., a radius, width, height, etc.) that is greater than a corresponding dimension of the microfluidic channel 202. For example, a diameter of the microfluidic channel is less than a diameter of the capillary chamber 204. It will be appreciated that the change in dimension from the microfluidic channel 202 to the capillary chamber 204 breaks capillary action caused by the microfluidic channel 202 on the fluid. In turn, the fluid forms the meniscus 210.

FIGS. 6A-6C provide block diagrams that illustrate flow of a fluid in an example microfluidic device 250. In FIGS. 6A-C, the example microfluidic device 250 comprises a capillary chamber 252, a nozzle layer 254 that has a nozzle orifice 256 formed therein, a microfluidic channel 255, a restriction section 258, and a fluidic actuator 260. In this example, fluid in the capillary chamber 252, microfluidic channel 255, and restriction portion 258 may be under backpressure in a direction provided by example directional arrow 262 such that a meniscus 264 occurs at the capillary chamber 252. As discussed previously, capillary force exerted on fluid in the capillary chamber 252 may restrict flow of fluid in the direction of backpressure. In the example of FIGS. 6A-C, the fluidic actuator 260 may be a thermal resistor based fluidic actuator.

Accordingly, in FIG. 6B, the fluidic actuator 260 is actuated such that a bubble 280 forms in fluid proximate the fluidic actuator 260. As shown, the bubble 280 displaces a droplet of fluid 282 such that the droplet of fluid is ejected via the nozzle orifice 256 of the nozzle layer 254. Hence, actuation of the fluidic actuator 260 to thereby form a bubble 280 may further cause flow of fluid in the direction of the backpressure (example directional arrow 262). As shown, the droplet of fluid 282 ejects in a direction from the nozzle orifice 256 that is opposite the direction of backpressure 262.

In FIG. 6C, fluid has flowed from the capillary chamber 252, microfluidic channel 255, and the restriction section 258 in the direction of the backpressure 262. In particular, a defined volume of fluid may flow through the capillary chamber 252, microfluidic channel 255, and the restriction section 258 such that a meniscus 290 occurs at the restriction section 258. Further flow of fluid may be restricted by the restriction section 258 due to surface tension of the meniscus 290 and capillary action associated with the restriction section 258. As will be appreciated, the volume of fluid that may flow through the capillary chamber 252 may correspond to a volumetric size of the microfluidic channel 255 and the capillary chamber 252. Therefore, the amount of fluid that may flow through the microfluidic channel 255, capillary chamber 252, and the restriction section 258 may be predetermined based at least in part on the volumetric size of the capillary chamber 252 and the microfluidic channel 255.

As will be appreciated in the example of FIGS. 6A-C, the capillary chamber 252 has at least one dimension (e.g., a radius, width, height, etc.) that is less than a corresponding dimension of the microfluidic channel 255. For example, a diameter of the capillary chamber 252 may be less than a diameter of the microfluidic channel 255. It will be appreciated that the at least one dimension of the capillary chamber 252 may cause a capillary force opposite the direction of the backpressure 262. In turn, the fluid forms the meniscus 264. Similarly, the restriction section 258 may have at least one dimension that is less than the microfluidic channel 255 such that after flow of the predetermined volume of fluid in the direction of the backpressure 262, the meniscus 290 occurs at the restriction section 258 to restrict further flow of fluid.

FIG. 7 provides a flowchart 300 that illustrates a sequence of operations that may be performed by an example microfluidic device. In this example, fluid may be passively pumped to a capillary break channel via a microfluidic channel (block 302). Flow of the fluid through the capillary break channel may be restricted by the capillary chamber (block 304). A fluidic actuator may be actuated to initiate flow of fluid through the capillary chamber (block 306). In some examples, flow of the fluid may be restricted after flow of a predetermined volume of the fluid by a restriction section of the microfluidic device (block 308).

The flowchart of FIG. 7 provides an example sequence of operations that may be performed by an example microfluidic device to perform example processes and methods as described herein. In some examples, some operations of the example processes and/or methods disclosed in the flowchart of FIG. 7 may be performed by a controller implemented in a microfluidic device.

Accordingly, the examples described herein provide examples of a microfluidic device in which at least one capillary chamber may be fluidly connected to a microfluidic channel. In these examples, the capillary chamber may restrict flow of fluid in the microfluidic device. Moreover, flow of fluid may be initiated through a capillary chamber by actuation of a fluidic actuator positioned proximate the capillary chamber. In addition, example devices as described herein may facilitate manipulation of small volumes of fluid (e.g., approximately 1 nL to approximately 1 pL). Because examples described herein facilitate passive pumping of such small volumes of fluid, examples may be implemented as valve mechanisms in microfluidic systems.

The preceding description has been presented to illustrate and describe examples of the principles described. This description is not intended to be exhaustive or to limit these principles to any precise form disclosed. Many modifications and variations are possible in light of the above disclosure.

The invention claimed is:

1. A microfluidic device comprising:
a microfluidic channel dimensioned to cause passive flow of fluid by capillary action, the microfluidic channel having a first dimension proximate to a capillary chamber;
the capillary chamber fluidly connected to the microfluidic channel, the capillary chamber having a second dimension proximate to the microfluidic channel, wherein the second dimension is different than the first dimension, and wherein:
a transition between the microfluidic channel and the capillary chamber, including the difference between the second dimension of the capillary chamber and the first dimension of the microfluidic channel, and surface tension of the fluid cause occurrence of a meniscus in the fluid and the meniscus is to break the capillary action and to cause a restriction of the flow of fluid through the capillary chamber; and
a fluidic actuator disposed in the microfluidic channel proximate to an inlet of the capillary chamber from the microfluidic channel, the fluidic actuator to actuate to displace fluid in the microfluidic channel proximate to the inlet and thereby initiate flow of fluid through the capillary chamber by overcoming the restriction of the flow of fluid.

2. The microfluidic device of claim 1, wherein:
the fluidic actuator comprises a thermal resistor actuator, a piezoelectric membrane actuator, or a combination thereof;
the first dimension comprises a width, a length, or a height of the microfluidic channel; and
the second dimension comprises a width, a length, or a height of the capillary chamber.

3. The microfluidic device of claim 1, wherein the microfluidic channel has the first dimension that is less than the second dimension of the capillary chamber such that the difference between the first dimension and the second dimension is to break a capillary force associated with the capillary action caused by the microfluidic channel to thereby restrict the flow of fluid therethrough caused by the capillary action.

4. The microfluidic device of claim 1, wherein the microfluidic device includes a restriction section fluidly connected to the microfluidic channel and the capillary chamber to restrict fluid flow initiated by the fluidic actuator after flow of a predetermined volume of fluid.

5. The microfluidic device of claim 4, wherein the capillary chamber has the second dimension that is less than the first dimension of the microfluidic channel, and the restriction section has a third dimension that is less than the first dimension of the microfluidic channel and is greater than the second dimension of the capillary chamber.

6. The microfluidic device of claim 1 further comprising:
a nozzle layer having a nozzle orifice formed therein, the nozzle orifice fluidly connected to the capillary chamber,
wherein the fluidic actuator is configured to eject a droplet of fluid via the nozzle orifice.

7. The microfluidic device of claim 1, wherein the capillary chamber has the inlet and an outlet, the microfluidic channel is a first microfluidic channel, the first microfluidic channel is fluidly connected to the inlet of the capillary chamber, and the microfluidic device further comprises:
a second microfluidic channel fluidly connected to the outlet of the capillary chamber,
wherein the transition between the microfluidic channel and the capillary chamber, including the difference between the second dimension of the capillary chamber and the first dimension of the microfluidic channel, and the surface tension of the fluid cause the meniscus in the fluid that restricts the flow of fluid through the capillary chamber to the second microfluidic channel by the break of the capillary action, and actuation of the fluidic actuator is to cause flow of fluid through the capillary chamber to the second microfluidic channel by overcoming the restriction of the flow of fluid caused by the transition and the surface tension.

8. The microfluidic device of claim 7, wherein the capillary chamber is a first capillary chamber, the fluidic actuator is a first fluidic actuator, and the microfluidic device further comprises:
a third microfluidic channel;
a second capillary chamber having an inlet and outlet, the inlet of the second capillary chamber fluidly connected to the second microfluidic channel, the second microfluidic channel having a third dimension proximate to the second capillary chamber, the inlet having a fourth dimension that is different than the third dimension, wherein the second microfluidic channel is dimensioned to cause flow of fluid by capillary action, the outlet of the second capillary chamber fluidly connected to the third microfluidic channel, and wherein a transition between the second microfluidic channel and the second capillary chamber, including the difference between the third dimension and the fourth dimension at the inlet of the second capillary chamber, and surface tension of the fluid cause occurrence of another meniscus in the fluid and the other meniscus is to cause a second restriction of flow through the second capillary chamber to the third microfluidic channel by breaking the capillary action caused by the second microfluidic channel; and a second fluidic actuator disposed in the second microfluidic channel proximate to the inlet of the second capillary chamber, the inlet of the second capillary chamber being proximate to the second microfluidic channel and the second capillary chamber, the second fluidic actuator to actuate and thereby initiate flow of fluid through the second capillary chamber to the third microfluidic channel by displacing fluid in the second microfluidic channel proximate to the inlet of the second capillary chamber and overcoming the second restriction of the flow of fluid.

9. The microfluidic device of claim 1, wherein the microfluidic channel is a first microfluidic channel of a set of microfluidic channels, the capillary chamber is a first capillary chamber of a set of capillary chambers, and the fluidic actuator is a first fluidic actuator of a set of fluidic actuators, wherein each capillary chamber of the set of capillary chambers has a respective inlet and a respective outlet, each respective microfluidic channel of the set of microfluidic channels is fluidly connected to a respective inlet of a respective capillary chamber, each respective microfluidic channel is dimensioned to cause flow of fluid by capillary action and have respective first dimensions proximate to the respective capillary chamber, and each respective inlet of each respective capillary chamber have respective second dimensions that are different than the first dimensions and which are disposed at each respective inlet and proximate to the respective microfluidic channel, and wherein respective transitions between each respective microfluidic channel and the respective capillary chamber, including the difference between the first dimensions and the second dimensions, and surface tension of the fluid each cause occurrence of the meniscus in the fluid and the meniscus is to restrict flow of fluid therethrough by breaking of the capillary action caused by the respective microfluidic channel, and wherein each fluidic actuator of the set of fluidic actuators is disposed in the respective microfluidic channel proximate to the respective inlet of the respective capillary chamber, each respective fluidic actuator is to actuate to thereby initiate fluid flow through the respective capillary chamber.

10. The microfluidic device of claim 1, further comprising:

a reservoir fluidly connected to the capillary chamber via the microfluidic channel, wherein fluid is drawn from the reservoir, and a controller electrically connected to the fluidic actuator to transmit an electric signal to the fluidic actuator, and in response, cause the actuation of the fluidic actuator, and, in response to the fluid flowing through the capillary chamber, the capillary action further pumps the fluid.

11. The microfluidic device of claim 1, further comprising a controller electrically connected to the fluidic actuator, the controller to transmit an electrical signal to the fluidic actuator to cause the fluidic actuator to actuate.

12. The microfluidic device of claim 1, wherein:

the first dimension of the microfluidic channel includes a width, a length, or a height of the microfluidic channel proximate to the inlet of the capillary chamber; and the second dimension of the capillary chamber includes a height, a width, or a length of the inlet.

13. A microfluidic device comprising:

a microfluidic channel dimensioned to cause flow of fluid by capillary action, the microfluidic channel having a first dimension proximate to a capillary chamber;

the capillary chamber fluidly connected to the microfluidic channel, and the capillary chamber having an inlet with a second dimension proximate to the microfluidic channel wherein the second dimension is different than the first dimension, wherein:

a transition between the microfluidic channel and the capillary chamber, including the difference between the second dimension of the inlet of the capillary chamber and the first dimension of the microfluidic channel, and surface tension of the fluid cause occurrence of a meniscus in the fluid and the meniscus is to break the capillary action and to cause a restriction of the flow of fluid therethrough;

a fluidic actuator positioned proximate to the inlet of the capillary chamber, the fluidic actuator to actuate to displace fluid in the microfluidic channel proximate to the inlet of the capillary chamber and thereby cause flow of fluid through the capillary chamber by overcoming the restriction of the flow of fluid; and a restriction section fluidly connected to the microfluidic channel and the capillary chamber, the restriction section having a third dimension proximate to the capillary chamber, the third dimension being different than the second dimension, and another transition between the restriction section and the capillary chamber, including the difference between the third dimension and the second dimension, and surface tension of the fluid cause occurrence of another meniscus and the other meniscus is to cause restriction of the flow of fluid initiated by actuation of the fluidic actuator, wherein the other meniscus is formed at the restriction section in response to flow of a predetermined volume of fluid through the capillary chamber.

14. The microfluidic device of claim 13, further comprising a nozzle layer having a nozzle orifice formed therein, the nozzle orifice fluidly connected to the capillary chamber, wherein the fluidic actuator to actuate is further to eject a droplet of fluid via the nozzle orifice.

15. The microfluidic device of claim 14, wherein the microfluidic channel and capillary chamber are configured to flow fluid under backpressure in a direction opposite a direction in which the droplet of fluid is to eject, the microfluidic device further comprising:

a controller electrically connected to the fluidic actuator to transmit an electric signal to the fluidic actuator, and in response, cause the actuation of the fluidic actuator for a duration of between approximately 0.1 milliseconds to approximately 10 milliseconds.

16. The microfluidic device of claim 13, further comprising a controller electrically connected to the fluidic actuator, the controller including a non-transitory machine-readable medium storing instructions that, when executed by the controller, cause the controller to transmit an electrical signal to the fluidic actuator to cause the fluidic actuator to actuate.

17. A method for a microfluidic device comprising:

moving fluid from a reservoir to a capillary chamber via a capillary action within a microfluidic channel fluidly connected therebetween, the microfluidic channel having a first dimension proximate to the capillary chamber and the capillary chamber having a second dimension proximate to the microfluidic channel;

restricting flow of the fluid through the capillary chamber by causing occurrence of a meniscus in the fluid and breaking the capillary action via a transition between the first dimension of the microfluidic channel and the second dimension of the capillary chamber and a surface tension of the fluid, wherein the second dimension is different than the first dimension; and actuating a fluidic actuator disposed in the microfluidic channel proximate to an inlet of the capillary chamber from the microfluidic channel to displace fluid in the microfluidic channel and initiate flow of the fluid through the capillary chamber by overcoming the restriction of the flow of fluid.

18. The method of claim 17 further comprising:

further restricting flow of fluid after a predetermined volume of fluid has flowed with a restriction section fluidly connected to the microfluidic channel and capillary chamber.

19. The method of claim 17, wherein actuating the fluidic actuator further comprises causing a bubble to form and collapse within the microfluidic channel proximate to the inlet of the capillary chamber, and in response, displacing the fluid in the microfluidic channel proximate to the inlet, the method further comprising:

in response to the fluid flowing through the capillary chamber, further flowing the fluid via the capillary action.

20. The method of claim 17, wherein actuating the fluidic actuator further comprises causing movement of a piezoelectric membrane of the fluidic actuator disposed proximate to the inlet of the capillary chamber, and in response, displacing the fluid in the microfluidic channel proximate to the inlet.

* * * * *